United States Patent [19]
Tzu et al.

[11] Patent Number: 5,994,009
[45] Date of Patent: *Nov. 30, 1999

[54] INTERLAYER METHOD UTILIZING CAD FOR PROCESS-INDUCED PROXIMITY EFFECT CORRECTION

[75] Inventors: San-De Tzu, Taipei; Shih-Chiang Tu, Tanyon; Chia-Hui Lin, Hsin-Chu, all of Taiwan

[73] Assignee: Taiwan Semiconductor Manufacturing Company, Ltd., Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/971,541

[22] Filed: Nov. 17, 1997

[51] Int. Cl.$^6$ ........................................................ G03F 9/00
[52] U.S. Cl. ........................... 430/30; 430/296; 395/500.2
[58] Field of Search .................... 430/30, 296; 395/500.2

[56] References Cited

U.S. PATENT DOCUMENTS 5,208,124  5/1993  Sporon-Fiedlen et al. ............. 430/296
5,254,438  10/1993  Owen et al. ............................. 430/296
5,432,714  7/1995  Chung et al. ........................... 430/296
5,667,923  9/1997  Kanata .................................... 430/296
5,736,281  4/1998  Watson .................................... 430/296
5,792,581  8/1998  Ohnuma .................................. 430/296

*Primary Examiner*—Christopher G. Young
*Attorney, Agent, or Firm*—Tung & Associates

[57] ABSTRACT

The present invention discloses a novel method for interlayer corrections for photolithographic patterns that are reproduced on a wafer surface capable of correcting not only the optically-induced proximity effect but also the process-induced proximity effect. In the method, a conventional optical proximity correction is first performed on a photomask, the corrected photomask is then used to produce a pattern on a wafer surface. The various critical dimensions bias values at a multiplicity of locations are then measured and fed back to the computer aided design data file for the photomask for producing patterns that are corrected for both optically-induced and process-induced proximity effect on a wafer surface.

10 Claims, 3 Drawing Sheets

INTERLAYER METHOD UTILIZING CAD FOR PROCESS-INDUCED PROXIMITY EFFECT CORRECTION

FIELD OF THE INVENTION

The present invention generally relates to a method for correcting photolithographic patterns reproduced on a wafer surface and more particularly, relates to a method for reproducing photolithographic patterns that are corrected not only for the optically-induced proximity effect but also for the process-induced proximity effect.

BACKGROUND OF THE INVENTION

A steady increase in the number of transistors that can be built on a chip surface has gain importance in microelectronics during the past decades. The industry data show that the number of bits/chip will be increased from 1 kilobit (Kb) in the late 1960's to 1 Gigabit (Gb) by the end of the decade. It is recognized that device geometries both in the horizontal and in the vertical directions, must shrink steadily to allow such an increase in density to occur. One other benefit achieved by the scaling down of devices to smaller geometries is the increase in circuit speed. The smaller the minimum feature size, i.e., the minimum line-width or line-to-line separation that can be printed on the surface of a wafer, the larger the number of circuits can be placed on the chip resulting in a higher circuit speed.

One of the most frequently used processing techniques in microelectronics for fabricating integrated circuits (ICs) and very large scale ICs (VLSI) is lithography. The term lithography is used to describe a process in which a pattern is reproduced in a layer of material that is sensitive to photons, electrons or ions. The principle is similar to that used in photography in which an object is imaged on a photosensitive emulsion film. After development, the exposed regions of the film are left as a layer of metallic silver, while the unexposed regions are removed, resulting in a printed image of the object. While the final product is a printed image in photography, the image in microelectronics is typically an intermediate pattern which defines regions where material is to be etched or implanted.

The manufacturing process for IC devices is dependent upon the accurate reproduction of computer aided design (CAD) generated patterns onto the surface of a substrate. The replication process is typically performed by a lithographic technique, specifically an optical lithographic technique, that is preceded and followed by a variety of etching and ion implantation processes. Lithography is a critical step in semiconductor manufacturing because it is used repeatedly in a process sequence that depends on the device design. The lithographic process determines the device dimensions, which affect not only the quality but also its production volume and manufacturing cost. Lithography transforms complex circuit diagrams into patterns which are defined on the wafer in a succession of exposure and processing steps to form a number of superimposed layers of insulators, conductors and semiconductor materials. For instance, typically between 5 and 30 lithographic steps and several hundred processing steps between exposures are required to fabricate a semiconductor IC package.

A typical photolithographic process can be carried out on a wafer surface by the operating steps of first oxidizing the silicon surface to obtain a thin layer of silicon dioxide, then coating a layer of material that is sensitive to radiations such as ultraviolet light, electron beams or X-ray beams, then imprint a latent image on the material by a lithographic patterning technique, then amplify the latent image by an appropriate development method, the reserve areas delimiting the design to be reproduced on the silicon dioxide layer, then stabilize the image by an appropriate fixing method or a lithography method, and then plasma etching the silicon dioxide surface through openings obtained in the dioxide layer to obtain areas variously doped in the silicon dioxide subsequently defining two-dimensional geometric shapes on the surface of the substrate for the circuit, such as the gate electrodes, contacts, vias and metal interconnects.

Optical lithography, as commonly used in the manufacture of integrated circuits (ICs) and very large scale ICs (VLSI), involves a series of steps for obtaining complex etched structures on a wafer. An optical lithographic patterning process involves the illumination of a metallic coated quartz plate known as a photomask which contains a magnified image of the computer generated pattern etched into the metallic layer. An illuminated image is reduced in size and patterned onto a photosensitive film deposited on the device substrate. Each time the photolithographic steps are repeated, the accuracy of the process determines the quality and the yield of the IC fabrication process. The performance enhancement of advanced VLSI circuitry is increasingly limited by the lack of pattern fidelity in a series of lithographic and reactive ion etching (RIE) processes conducted at extremely small dimensions (e.g., in the sub-half-micron level). In a photolithographic process, a pattern is transferred from a photomask to a photosensitive film (i.e., a photoresist layer) on a wafer. In the RIE process, the pattern in the photoresist is in turn transferred into a variety of conductive or insulating films on the wafer substrate. A successful fabrication process for integrated circuits is therefore closely dependent upon a successful lithographic technique.

During each lithographic step, deviations may be introduced to distort the image that the photomask transfers to the wafer surface. For example, as a result of an optical interference and other interferences which occur during a pattern transfer, images formed on a wafer surface deviate from the original dimension and shape of the photomask that was stored in the computer. The deviations depend on the characteristics of the pattern as well as a variety of processing parameters. Since deviations significantly affect the performance of a semiconductor device, different techniques have been developed to focus on methods of compensation for the optical proximity effect so that they can be included in a CAD file to improve the image transfer process.

The pattern geometries used in fabricating IC devices are frequently of rectangular shape. When rectilinear geometries are printed on a wafer surface, problems are frequently observed at the corner regions of the pattern. For instance, when exposed to light or radiation, a photoresist integrates energy contributions from all surrounding areas. This means that the light intensity in one vicinity of the wafer is affected by the light intensity in neighboring vicinities. This phenomenon and, in general, distortions that affect dimensions and shapes of wafer features are referred to as proximity effects.

With the advancement in modern computer aided design technology, it is possible to predict the proximity effect and to modify a layout to offset the expected deviations. A selective biasing of mask patterns to compensate for pattern deviations occurring during wafer processing is therefore a desirable alternative to the costly development of new higher resolution processes. The term optical proximity correction (OPC) is therefore used to describe the process of selective biasing in mask patterns for compensating a proximity effect occurred in an optical image transfer process. The technique of biasing patterns to compensate for image transfer deviations has also been applied to E-beam lithography to counteract the effects of back scattered electrons. The techniques of OPC therefore enable the use of an automatic pattern biasing concept in pattern transfer processes in VLSI and ULSI technologies.

To implement an OPC process, a series of shrink and expand operations is employed to fracture a CAD pattern data base into basic rectangles abutting at vertices existing in the original design. The rectangles are then classified as to their functional relevance based on their spatial relationships to prior or subsequent CAD design levels. By shifting the edges of only the basic rectangles deemed relevant for the improvement of the VLSI device performance, the generation of new vertices is minimized and effort is expended only on high value added portions of the circuit design. For example, a plurality of gate regions in a CAD design is first identified. Then, a plurality of design shapes in the CAD design is sorted according to their geometric types. The plurality of sorted design shapes shares at least one side with a second design shape. The sorted design shapes are then grouped according to their widths. Finally, all of the grouped design shapes having been identified as gate regions are biased based on applicable OPC rules. FIGS. 1A and 1B show test patterns before and after OPC are printed on a plain wafer that does not have topography or other process-induced CD variations. It is possible to get a corrected pattern through theoretical aerial image correction on plain wafers by a commercial OPC software. However, the software would not work on wafers that have topography or other process-induced CD variations.

In practice, when a photomask is received from a customer and reproduced on a wafer surface, there are frequently critical dimension (CD) variations at various locations on the wafer surface caused by optical distortions. Conventionally, these CD variations are compensated by using commercially available software for computer aided design files. Another conventional method for compensating CD variations caused by distortions formed in optical imaging on a photoresist layer, i.e., sometimes known as a photoresist swing effect, is to add an anti-reflection coating layer prior to the coating of the photoresist layer. For instance, when a wafer surface has been processed to provide a thin gate oxide layer and thick field oxide regions, and a polysilicon layer is subsequently deposited thereon, an anti-reflection layer (i.e., a bottom anti-reflective coating (BARC) layer) can be first coated to cover the polysilicon layer. A photoresist layer is then coated on top of the BARC layer. Since the swing effect is caused by the reflectance of incident light beams on a wafer surface and the formation of constructive and destructive interferences, the additional layer of BARC substantially eliminates light reflectance from the wafer surface by absorbing lights and thus minimizing a photoresist swing effect. Substantially smaller CD variations on the surface of the wafer can be achieved by the BARC addition.

Additional problem that causes proximity effect on the surface of a wafer is the topography of the wafer surface formed after the deposition of a polysilicon and an anti-reflectance coating layer. Topography exists even after a planarization process has been conducted on the wafer surface. For instance, when a polysilicon conducting line is formed on a wafer surface which has a thin oxide coating layer at certain sections and thick field oxide layers at other sections, the width of the conducting line formed at different locations, i.e., on top of the thin oxide region or the thick field oxide regions, are different. The reason for the variation in the width of the polysilicon line formed is the variations in the thicknesses of the photoresist layer coated. This is shown in FIG. 2.

It is seen in FIG. 2 that when substrate 26 is formed with a thin oxide layer 28 and thick field oxide regions 30 on top, the polysilicon layer 34 deposited conforms to the topography of the oxide layers. The topography of the polysilicon layer 34 is then reproduced in a BARC layer 36 subsequently deposited on top of the polysilicon layer for reducing a swing effect on the photoresist layer. However, as seen in FIG. 2, the photoresist layer 42 subsequently coated on top of the BARC layer 36 has significant thickness variations. For instance, the photoresist layer 42 at section 44 is substantially thicker than at section 46. It is known that during a photoresist imaging process, the photoresist layer is subjected to the same exposure dose of either an optical source or an electron-beam source. Consequently, the energy dosage requirement between sections 46 and 44 is different due to the different resist thickness. As a result, the latter needs lesser exposure dosage than the former. This creates a CD variation on the polysilicon line formed from the polysilicon layer 34.

Even though the utilization of a bottom anti-reflective coating layer reduces a photoresist swing effect, the CD variations on the feature formed (i.e., the line) still exist. Moreover, the anti-reflective coating layer is frequently coated of an organic material which has approximately the same etch rate as an organic photoresist layer during a photoresist etching process. It is therefore necessary, when the substrate must be etched all the way through so that its surface can be exposed, to first etch away the BARC layer before the polysilicon layer can be etched. The utilization of a BARC layer therefore creates process complications for a semiconductor fabrication process. First, the additional cost of a BARC layer and the processing time required for coating such layer contribute to the total fabrication costs. Secondly, the etching process for the polysilicon layer becomes more complicated since the process must also etch away the BARC layer. Thirdly, the thickness of the photoresist layer deposited on top of the wafer surface can not be reduced in order for the photoresist to function satisfactory. It is known that the resolution achieved in a photolithographic process is inversely proportional to the thickness of the photoresist layer. Therefore, the thicker photoresist layer required in a photolithographic process produces a less than satisfactory resolution.

It is therefore an object of the present invention to provide a method for proximity correction on a wafer surface during a photolithographic process that does not have the drawbacks and shortcomings of the conventional proximity correction methods.

It is another object of the present invention to provide a method for interlayer proximity correction on a wafer surface that eliminates the need for an anti-reflective coating layer.

It is a further object of the present invention to provide an interlayer method for proximity correction on a wafer surface during a photolithographic process by first correcting optically induced proximity effect and then correcting process-induced proximity effect.

It is another further object of the present invention to provide an interlayer method for proximity correction on a wafer surface during a photolithographic process by first conducting an optical proximity correction and then performing a photomasking process to measure the CD variations on a wafer surface and to feedback the variations to a computer aided design file for correcting the process-induced proximity effect.

It is still another object of the present invention to provide an interlayer method for proximity correction on a wafer surface during a photolithographic process which is capable of correcting process-induced proximity effect such as line-end shortening and photoresist swing effect.

It is yet another object of the present invention to provide a method for proximity correction on a wafer surface during a photolithographic process that can be used effectively to correct proximity effect caused by topography on the wafer surface.

It is still another further object of the present invention to provide an interlayer method for proximity correction on a wafer surface during a photolithographic process in which the proximity effect existed between a polysilicon layer and an underlying oxide layer can be effectively corrected.

SUMMARY OF THE INVENTION

In accordance with the present invention, an interlayer method for proximity correction on a wafer surface for a photolithographic method is provided. The method does not require the additional coating of an anti-reflective coating layer and can be carried out by measuring CD variations on a wafer surface after the execution of a conventional optical proximity correction and then feeding back the CD variations into a computer aided design file for the photomask.

In a preferred embodiment, a method for proximity correction on a wafer surface for a photolithographic process can be carried out by the operating steps of first providing a computer aided design file containing a photomask pattern, then performing an optical proximity correction for correcting the optically induced proximity effect, then producing a photomask pattern after the OPC on a pre-processed wafer surface, then dividing the wafer surface into a multiplicity of sections and executing a logic method for determining process-induced critical dimension bias values in each of the multiplicity of sections, and then inputting the CD bias values into the computer aided design file to correct the process-induced proximity effect.

In another preferred embodiment, the present invention interlayer method for correcting a photomask pattern to compensate for process-induced proximity effect during a photolithographic process conducted on a wafer can be carried out by the operating steps of first providing a computer software for a photomask pattern, then modifying the software for optically-induced proximity effect by an optical proximity correction method, then providing a wafer that has a pre-processed top surface and a topography on the surface, then producing a photomask pattern on the pre-processed top surface of the wafer by the modified software, then dividing the topography on the wafer surface into a multiplicity of sections, then determining process-induced critical dimension bias values at each of the multiplicity of sections, and then feeding back the critical dimension bias values of each of the multiplicity of sections to the modified software for correcting the process-induced proximity effect.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a novel method for the interlayer proximity correction on a wafer surface during a photolithographic method by first performing a conventional optical proximity correction method and then measuring the critical dimension variations in a multiplicity of sections on the device, and then feeding back the critical dimension bias values at each of the multiplicity of sections to a computer aided design file containing the photomask pattern such that the process-induced proximity effect on the wafer surface can be corrected.

Figure 3A:
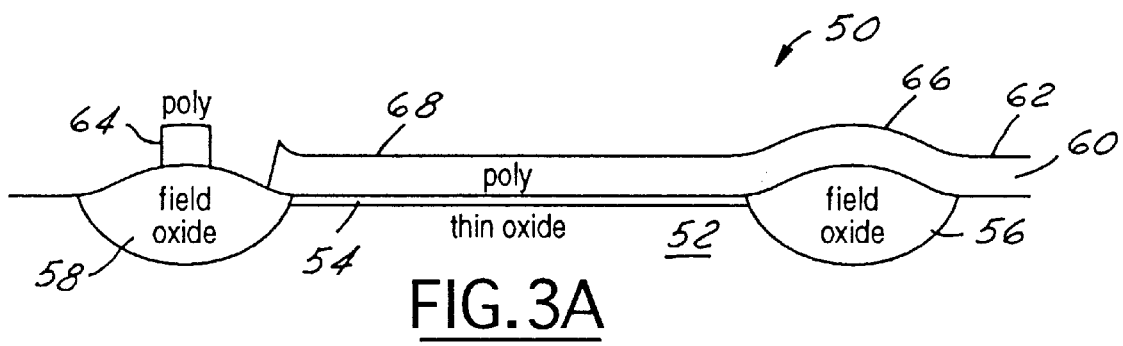
FIG. 3A is an enlarged, cross-sectional view of a semiconductor device that has a thin oxide layer, thick field oxide layers and a polysilicon layer deposited on top.

Referring initially to FIG. 3A, wherein an enlarged, cross-sectional view of a semiconductor device 50 is shown. The semiconductor device 50 consists of a silicon substrate 52 that has a thin oxide layer of approximately between 100 Å and 300 Å thickness deposited on top. The thin oxide layer can be advantageously used as a gate oxide insulator for devices to be built subsequently on top of the substrate 52. Birds beak type field oxide regions 56, 58 are then formed in the surface layer of the substrate 52. As seen in a normal birds beak formation process, the thick field oxide regions 56, 58 protrudes away from the surface of the substrate 52 to a height that is substantially greater than the thickness of the thin oxide layer 54. This creates a topography, i.e., a significant height difference, on the top surface of the substrate 52. After a conducting layer 60 of a material such as polysilicon is deposited, the surface 62 of the conducting layer 60 reproduces the topography that existed on the field oxide regions 56, 58 and on the thin oxide layer 54.

Figure 1A:
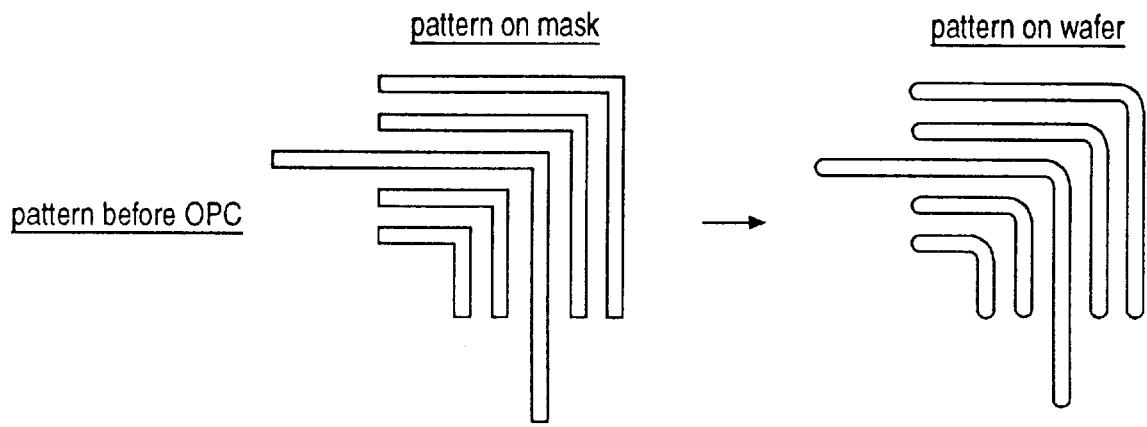
FIG. 1A is a schematic illustrating a photomask pattern and a pattern reproduced on a wafer surface without using an optical proximity correction technique.
Figure 1B:
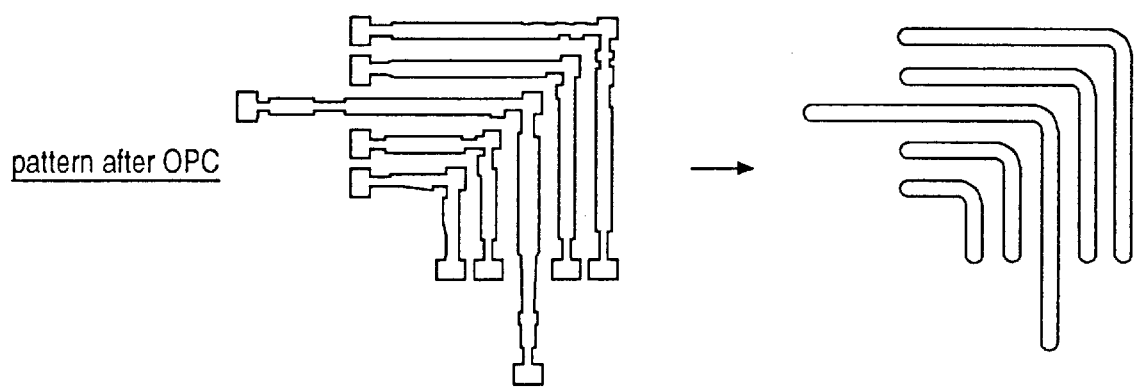
FIG. 1B is a schematic illustrating a photomask pattern and a pattern it reproduced on the a wafer surface incorporating a conventional optical proximity correction method.
Figure 2:
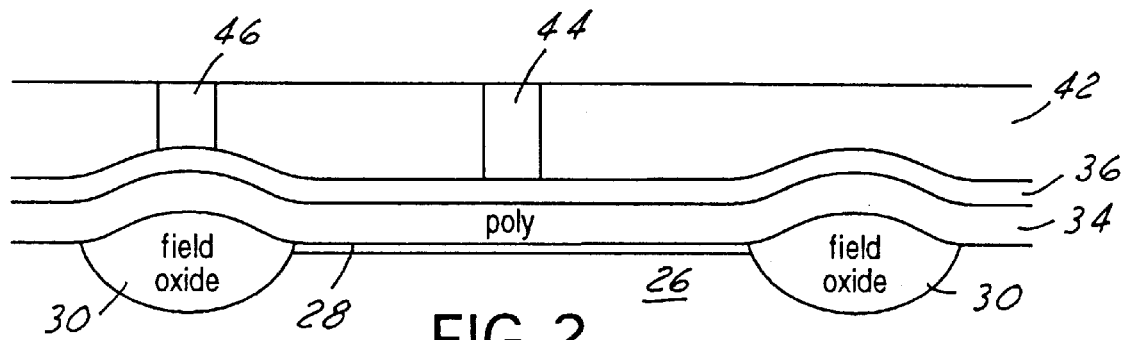
FIG. 2 is an enlarged, cross-sectional view of a conventional semiconductor device deposited with an anti-reflectance coating layer and a photoresist layer on top of the topography.

Conventionally, the topography of a photoresist layer (not shown) that is subsequently coated on top of the polysilicon layer 60 so that a polysilicon line 64 can be formed, shows a photoresist swing effect. In other words, when a photoresist layer is exposed on the wafer surface, it presents a certain degree of planarization effect. When there is a height difference in the layer as shown in FIG. 3A, i.e., at the high location 66 and at the low location 68, the thickness of the photoresist layer (not shown) subsequently coating will be different. This was shown in FIG. 2A. Ideally, the different sections of the photoresist layer that have different thicknesses should have different exposure dosages. However, since only one exposure dosage can be used on the photoresist layer, the line width of the polysilicon line formed is therefore different at locations where the photoresist layer has different thicknesses.

In a preferred embodiment of the present invention novel method of interlayer proximity correction, the process-induced proximity effect between sequentially deposited layers on a wafer surface can be substantially reduced or eliminated. These process-induced proximity effect can be caused by various processing factors such as line-end shortening, photoresist layer swing effect and etching microloading effect. In the present invention preferred embodiment, a standard process of optical proximity correction can be first carried out by a conventional method such that the proximity effect optically caused are corrected. A logic method can then be used to compare a layer deposited with a previously deposited layer, i.e., a silicon oxide insulating layer, by utilizing an OR or NOT operation. The line can be made wider or narrower depending on its location and on its critical dimension bias value. For instance, when a conducting line of polysilicon, such as that shown in FIGS. 3A and 3B, crosses over different structures of thin oxide and thick field oxide, effective correction can be achieved by utilizing the present invention novel method.

In a structure illustrated in FIG. 3A, for example, wherein a polysilicon layer crosses over both the thin oxide layer and the thick field oxide regions as either word lines or bit lines, the lines can be formed parallel to the field oxide regions or simultaneously crossing the thin oxide and the field oxide regions. When a conducting line of polysilicon crosses the same field oxide regions, there is no critical dimension variations. However, when the conductive line of polysilicon crosses over the thin oxide region, the signal observed is different than that received from the field oxide regions. A logic operation can then be used to calculate the critical dimension bias values and to determine if there is an overlap with the previously deposited oxide layers. When an overlap is detected, a bias value can be added to it by a feedback action into the computer aided design file for the photomask. A bias is thus added and CD variations are thus reduced.

The present invention method therefore greatly improves conventional optical proximity correction process and furthermore, no bottom ARC layer is required for correcting the proximity effect. The logic operation is a relatively simple calculation which first produces CD bias values for a multiplicity of sections on the wafer surface and then inputs into the original computer aided design file for the photomask so that the file can be used in an integral operation of an E-beam imaging process. The present invention preferred embodiment can be easily carried out to determine from the surface of a wafer after a conventional OPC process is first carried out so that areas that overlaps a previously deposited layer can be selected and divided into a multiplicity of sections for calculating their bias values.

Figure 3B:
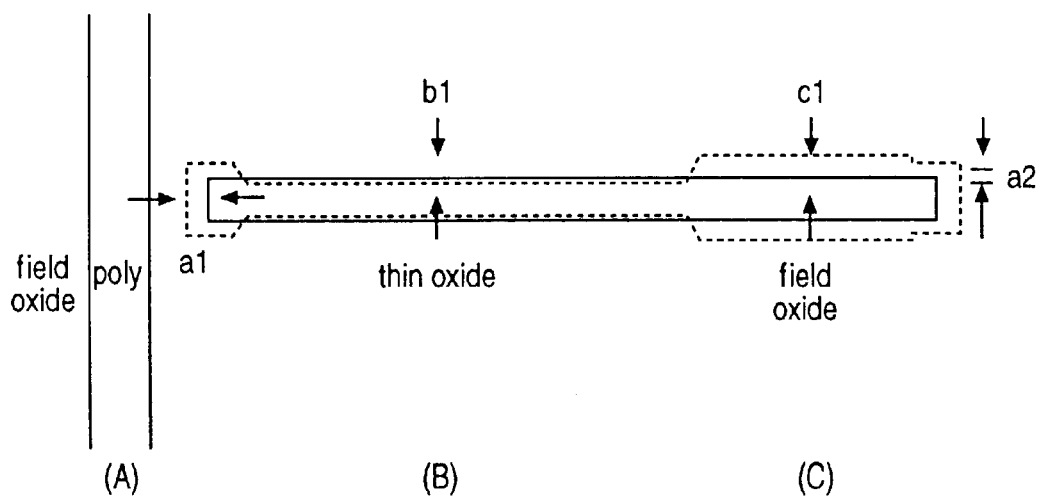
FIG. 3B is an illustration showing a plane view of the device of FIG. 3A incorporating the present invention correction method.

As shown in FIG. 3B, a typical calculation method for the critical dimension bias values is illustrated. A polysilicon conducting line crosses over sections A, B and C. At section A which indicates a line-end, there is a line-end shortening effect so that an "a1" bias value should be added to the CAD data so that the shortened line-end can be made wider to approximately its original photomask dimension. This is necessary since the polysilicon conducting line crosses over a field oxide region 56 (FIG. 3A) and becomes wider so that the addition of "c1" is necessary. To carry out the present invention novel method, a feedback action is required in which a photomask obtained after a conventional OPC process is imaged onto a wafer surface first and then the CD bias values at various locations can be determined. It should be noted that the swing effect or the critical dimension changes with the pattern density and the photoresist thickness on the surface of the wafer. A feedback action is therefore carried out such that the line width on the thin oxide region or on the thick oxide region can be determined to decide whether it has become thinner or thicker than the photomask and furthermore, whether an addition or deduction from the value is necessary.

As shown in FIG. 3B, at section (B), even though b1 is reduced in dimension, it actually becomes larger after a correction is made by the present invention method. As discussed before, at line-end, a value of a2 need to be added. In other words, on top of the thick field oxide regions, a CD bias value should be added to the line width due to the line-end shortening effect. The present invention novel method therefore can be easily carried out by actually examining the wafer surface and to determine whether the lines have become wider than the actual photomask width and then to make it narrower as required. Three different mathematical approaches can be utilized when there is a CD variation between two sections a and b. The difference between a and b is "a—b" and therefore one approach is to change all a to narrower, the other approach is to change all b to wider, the third approach is to compensate by changing a narrower and b wider. This can be determined in the process window.

It should be emphasized that the present invention method requires the actual execution of a photomask on a wafer surface as the first step, the CD bias values are then determined and fed back to the computer aided design data file for the photomask. In the procedure, for instance, the thickness of a photoresist coated on a silicon wafer can be measured. Due to the topography of the wafer, the thickness measured at each location may be different. Moreover, if a different pattern density exists, for instance, for a DRAM or a SRAM product, then even though the same spinning speed is used in a photoresist dispensing process where a photoresist layer is added on top of a topography, different CD variations are obtained. This can be effectively corrected by the present invention novel method which utilizes a feedback action to compensate for the changes in line width.

The present invention novel method can be executed in four separate steps. First, a conventional OPC process is carried out to compensate proximity effect caused by optical deviations. In the second step, a corrected photomask in the form of a computer aided design data file is used to produce a pattern on a wafer surface. In the third step of the process, a logic operation is used to determine the various critical dimension bias values at various sections that were previously divided. In the last step of the process, the critical dimension bias values calculated are fed back to the computer aided design data file for correcting CD difference that are process induced. A typical computer aided design data file may be of the GDS file or of any other suitable type.

It should be noted that, in the first step of the optical proximity correction process, there may be a large variety of patterns each having a different pattern density and a different dimension. As a result, different proximity effect are normally observed which can be corrected by a conventional software package that is used to minimize the optically induced proximity effect. The corrected photomask is then used on a real product such as a wafer surface to obtain the CD bias values. It should also be noted that the present invention method can be carried out without the need of the coating of an additional bottom ARC layer. A large set of CD bias values can be calculated which depends on the magnitude of the line shortening effect at various sections (i.e., on a thin oxide region or on thick oxide regions). In the logic operation, the results from the OPC correction can be used for comparison to the bottom inter-layer by cutting into various sections end zones on the circuit. The actual line width measurements are made by using scanning electron microscopy so that accurate measurements and the topography of the wafer surface can be obtained.

Figure 4A:
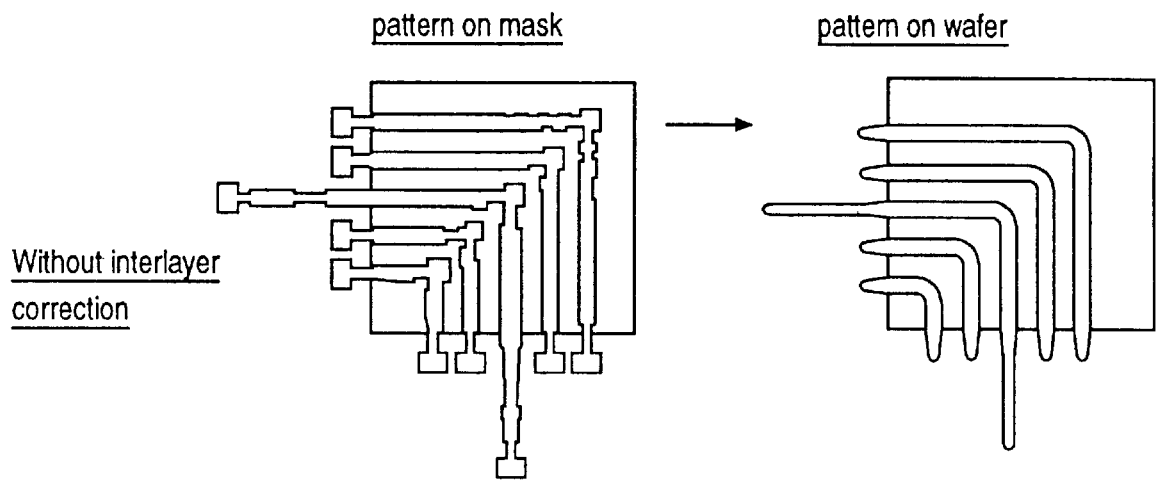
FIG. 4A is a schematic illustrating a photomask pattern and a pattern it reproduced on the surface of a wafer without using the present invention interlayer proximity correction.
Figure 4B:
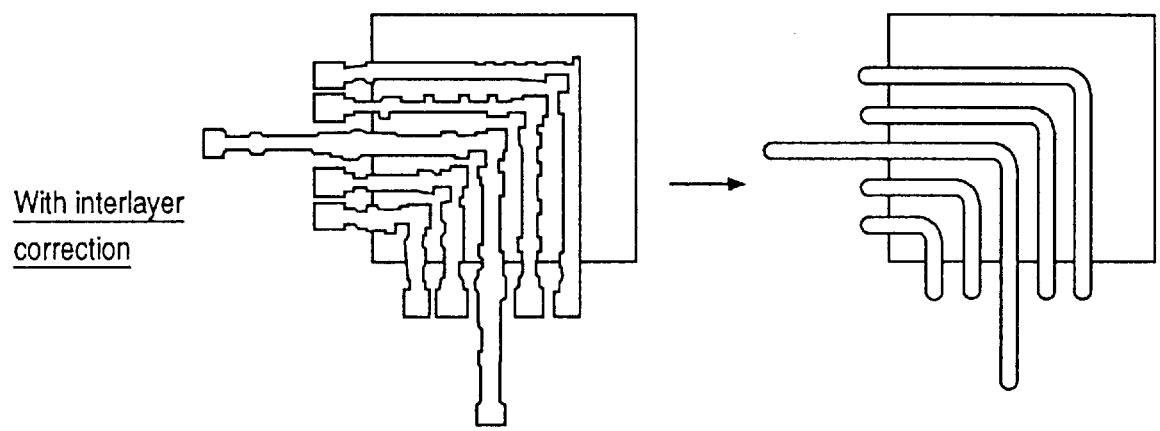
FIG. 4B is a schematic illustrating a photomask pattern and a pattern it reproduced on the surface of a wafer incorporating the present invention interlayer proximity correction method.

The desirable results achieved by the present invention novel method of interlayer proximity correction for correcting proximity effect caused by both optical reasons and process reasons are shown in FIGS. 4A and 4B. In FIG. 4A, the pattern shown is obtained without the present invention interlayer correction method. The corrected photomask pattern deposited on a wafer surface utilizing the present invention novel method is shown in FIG. 4B. The various critical dimension bias values which are added to the line width or which are deducted from the line width can be seen in the left hand portion of FIG. 4B.

While the present invention has been described in an illustrative manner, it should be understood that the terminology used is intended to be in the nature of words of description rather than of limitation.

Furthermore, while the present invention has been described in terms of a preferred embodiment, it is to be appreciated that those skilled in the art will readily apply these teachings to other possible variations within the scope of the invention.

The embodiments of the invention in which an exclusive property or privilege is claimed are defined in the following claims:

1. A method for proximity correction on a wafer surface during a non-electron beam photolithographic process comprising the steps of:
   providing a computer aided design (CAD) data file containing a photomask pattern, performing an optical proximity correction (OPC) for correcting optically-induced proximity effect, producing a photomask pattern for non-electron beam lithography after the OPC on a pre-processed wafer surface,
   dividing the wafer surface into a multiplicity of sections,
   executing a logic method for determining process-induced critical dimension (CD) bias values at each of said multiplicity of sections, and
   inputting the CD bias values into the CAD data file to correct the process-induced proximity effect.

2. A method according to claim 1, wherein said step of providing a computer aided design data file comprising the step of providing a GDS file.

3. A method according to claim 1, wherein said pre-processed wafer surface does not require the deposition of a bottom anti-reflectance coating layer.

4. A method according to claim 1, wherein said pre-processed wafer surface comprising an electrically conductive gate electrode layer deposited on a silicon oxide layer.

5. A method according to claim 4, wherein said electrically conductive gate electrode layer comprises a polysilicon layer.

6. A method according to claim 4, wherein said silicon oxide layer comprises thin oxide regions and thick field oxide regions.

7. A method according to claim 4, wherein said electrically conductive gate electrode layer has a top surface with a substantial topography.

8. A method according to claim 1, wherein said step of dividing said wafer surface into a multiplicity of sections further comprising the step of dividing said multiplicity of sections on the wafer surface so that surface areas having significant topography differences are included in said multiplicity of sections.

9. A method for correcting a photomask pattern to compensate for process-induced proximity effect during an optical lithography process conducted on a wafer comprising the steps of:
   providing a computer software for a photomask pattern,
   modifying the software for optically-induced proximity effect by an optical proximity correction method producing a modified software,
   providing a wafer having a pre-processed top surface and a topography on said surface,
   producing a photomask pattern for optical lithograph on the pre-processed top surface of the wafer by aid modified software,
   dividing the topography on said wafer surface into a multiplicity of sections,
   determining process-induced critical dimension (CD) bias values at each of said multiplicity of sections, and
   feeding back said CD bias values of each said multiplicity of sections to said modified software for correcting the process-induced proximity effect.

10. A method according to claim 9, wherein said pre-processed top surface of the wafer does not require the deposition of a bottom anti-reflectance coating layer.

* * * * *